United States Patent
Borkenhagen et al.

(10) Patent No.: US 6,940,760 B2
(45) Date of Patent: Sep. 6, 2005

(54) DATA STROBE GATING FOR SOURCE SYNCHRONOUS COMMUNICATIONS INTERFACE

(75) Inventors: John Michael Borkenhagen, Rochester, MN (US); Todd Alan Greenfield, Rochester, MN (US); James Anthony Marcella, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 174 days.

(21) Appl. No.: 10/662,080

(22) Filed: Sep. 12, 2003

(65) Prior Publication Data

US 2004/0071015 A1 Apr. 15, 2004

Related U.S. Application Data

(62) Division of application No. 09/836,651, filed on Apr. 17, 2001, now Pat. No. 6,671,211.

(51) Int. Cl.$^7$ .............................................. G11C 16/04
(52) U.S. Cl. ............................ 365/189.05; 365/230.08; 365/230.02
(58) Field of Search ....................... 365/189.05, 230.08, 365/230.02

(56) References Cited

U.S. PATENT DOCUMENTS

| | | | |
|---|---|---|---|
| 6,147,927 A | 11/2000 | Ooishi | ........................ 365/233 |
| 6,219,746 B1 | 4/2001 | Vogley | ........................ 711/104 |
| 6,316,980 B1 | 11/2001 | Vogt et al. | ................... 327/273 |
| 6,456,544 B1 * | 9/2002 | Zumkehr | ................. 365/233.5 |
| 6,768,690 B2 * | 7/2004 | Kwon et al. | ................. 365/194 |
| 6,834,023 B2 * | 12/2004 | Bell et al. | .............. 365/230.01 |
| 6,850,457 B2 * | 2/2005 | Cowles et al. | ......... 365/230.08 |

OTHER PUBLICATIONS

"Double Data Rate (DDR) SDRAM Specification", *JEDEC Standard*, JESD79, JEDEC Solid State Technology Association 2000, Arlington, VA, (Jun. 2000).

U.S. Appl. No. 09/617,558, entitled "Programmable Compensated Delay for DDR SDRAM Interface," filed on Jul. 17, 2000 by Borkenhagen et al. (ROC920000157US1).

* cited by examiner

*Primary Examiner*—Anh Phung
*Assistant Examiner*—Tuan T. Nguyen
(74) *Attorney, Agent, or Firm*—Wood Herron & Evans LLP

(57) ABSTRACT

A circuit arrangement and method are used in connection with a data latch that is coupled to a data source over a source synchronous communications interface to disable the data latch from latching data whenever the data source is not driving the source synchronous data strobe signal. As such, when the data source is not driving the source synchronous data strobe signal, undesired and/or inadvertent latching by the data latch can be avoided. Moreover, in implementations where a data strobe signal line is bidirectional, and capable of being driven either by the data source or by another circuit used to access the data source (e.g., a memory controller), disabling data latching as described herein can minimize the risk of driver damage resulting from conflicting attempts to drive the data strobe signal line at both ends.

15 Claims, 2 Drawing Sheets

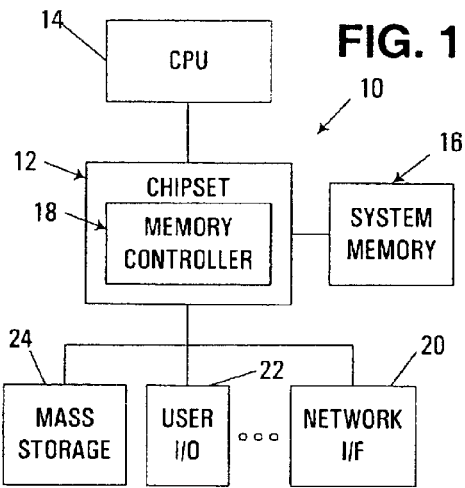
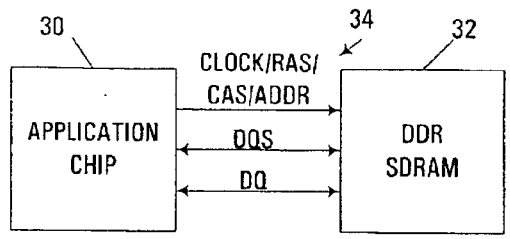
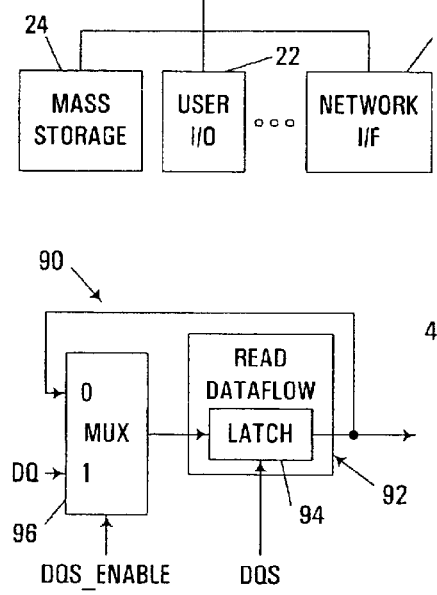
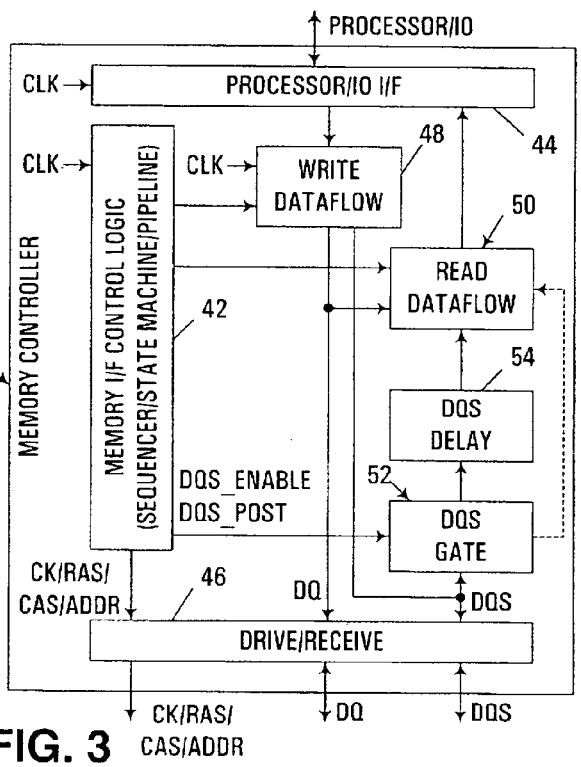
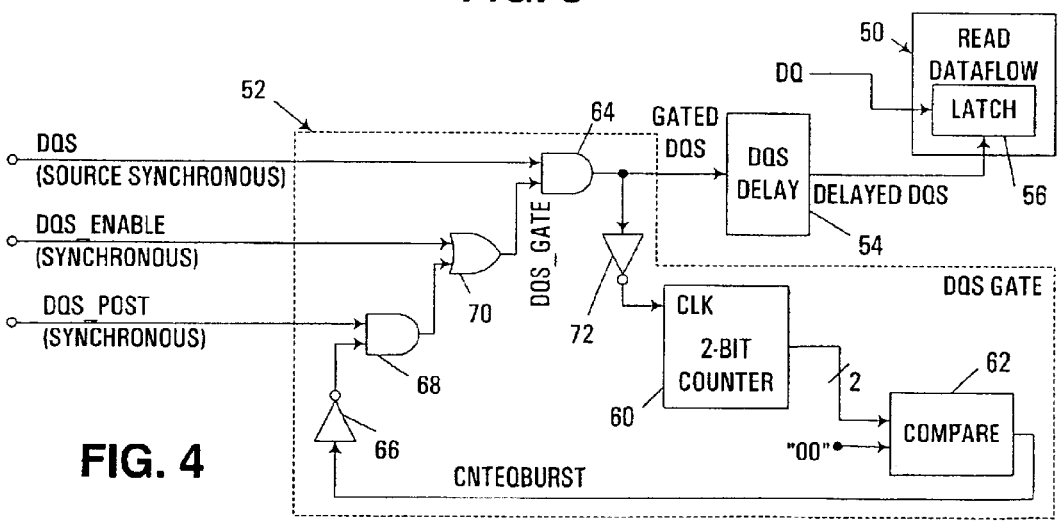

DATA STROBE GATING FOR SOURCE SYNCHRONOUS COMMUNICATIONS INTERFACE

CROSS-REFERENCE TO RELATED APPLICATION

This application is a divisional of U.S. patent application Ser. No. 09/836,651, filed on Apr. 17, 2001 now U.S. Pat. No. 6,671,211 by John Michael Borkenhagen et al. and entitled "DATA STROBE GATING FOR SOURCE SYNCHRONOUS COMMUNICATIONS INTERFACE," the disclosure of which is incorporated by reference herein.

FIELD OF THE INVENTION

The invention is generally related to data transmission over source synchronous communications interfaces, e.g., as with synchronous dynamic random access memory (SDRAM) memory interfaces.

BACKGROUND OF THE INVENTION

As computers and computer processors increase in performance, memory access performance becomes a significant bottleneck on overall system performance. The interface technology utilized to communicate data between a memory device and memory controller or other form of application device in particular can be a significant source of such a bottleneck.

For dynamic random access memory (DRAM) devices, which are commonly used as the main working memory for a computer, various interconnect technologies have been developed over the years. One such interconnect technology is used for synchronous DRAMs, or SDRAMs, which utilize a form of source synchronous interface, where the source of data during a memory transfer is relied upon to provide a clock signal, often referred to as a data strobe signal, that is used by a target for the data to capture such data as it is being transferred over a data line to the target. In particular, the capture of data on a data line is typically gated by the rising and/or falling edge of a data strobe signal, e.g., so that the value stored on a data line when the data strobe signal transitions from low to high (or visa-versa) will be latched into a data latch in the target.

Thus, assuming a memory controller coupled to an SDRAM is attempting to read data from the SDRAM, the SDRAM, as the source of the data, supplies data over one or more data lines, coupled with a data strobe signal on a separate line that is used by the memory controller to capture that data. Conversely, where a write to the SDRAM is being performed, the memory controller functions as the source of the data, and provides the data strobe signal to the SDRAM along with the data over the data lines.

A significant advantage to a source synchronous interface such as is used with SDRAM's is found in high frequency applications, as the delays inherent in signal transmission, e.g., due to transistor switching delays, transmission line propagation delays, etc., are comparatively greater at faster operating speeds, so having the same device driving the data and data strobe lines during a data transfer minimizes any misalignment between the data and data strobe lines (also referred to as skew).

Typically, to minimize the number of interconnections in an SDRAM memory interface, bidirectional transmission lines are utilized to handle the data and data strobe signals. Thus, during a read operation, the SDRAM drives the data and data strobe lines, while during a write operation, the memory controller drives these lines. The bidirectionality of the data and data strobe lines, however, can raise significant data integrity and reliability concerns.

In particular, it is often difficult to manage the control over a data strobe line to ensure that an appropriate data strobe signal is driven at the appropriate times and by the appropriate device, and without any undesired transitions, or "glitches" on the line. An unintended spike on a data strobe line, for example, may be interpreted by a latch on either the memory controller or the SDRAM as a data strobe signal transition, and cause whatever value is currently driven on the data line to be latched into that data latch. Such inadvertent latchings may produce data integrity problems, which at the best may reduce performance due to the need to repeat a faulty memory transfer operation, or at the worst may corrupt the data utilized by a data processing system.

Conventionally, to minimize the risk of unintended glitches on a data strobe line, a memory controller is configured to drive the line to a low state whenever a data transfer operation in not occurring. In the alternative, an external pull down resistor may be coupled to the data strobe line to prevent the line from settling to an indeterminate state when undriven.

However, as SDRAM interfaces are driven at higher speeds, control over the data strobe signal becomes a comparatively bigger problem, often resulting in more glitches on the data strobe line. Moreover, some SDRAM interfaces have been extended to support double data rate (DDR) capability, where data is clocked twice per cycle, on the rising and falling edges of the data strobe signal. Thus, the effective speed of a DDR SDRAM is roughly twice that of single data rate SDRAM, so the effects of signal skew are significantly greater.

Moreover, signal skew variations may make it difficult to ensure that only one source drives the data strobe signal at a time, often due to the inability to predict accurately whether a device coupled to the other end of the interface is going to be driving the data strobe signal. In this context, conventional manners of minimizing glitches on a data strobe signal line are inadequate. First, utilizing a memory controller to drive the data strobe line low when the line is not being used presents a significant risk of damaging or destroying the driver circuits on either or both of the memory controller and the SDRAMs. In particular, the sum of the delays present across an interface may be such that one source may attempt to drive the data strobe line while the other source is also attempting to drive the line, or alternatively, while the memory controller is holding the line in a low state to prevent glitches. Should both the memory controller and SDRAM attempt to drive the data strobe line simultaneously at different levels, excessive current would typically be generated across the line, and potentially damage or destroy the driver circuitry on either or both devices.

Second, the use of a pull down resistor is also not compatible with high speed operation, since the additional delays due to additional capacitance, current and wiring associated with the pull down resistor can restrict the maximum operating frequency of the interface.

Between read and write memory operations, a greater concern is typically presented with respect to read operations, since in a SDRAM source synchronous interface, the memory controller typically initiates all memory transfers, and generates the base clock from which the SDRAM operates. Thus, delays from the memory controller to the SDRAM, coupled with delays back to the memory controller when the SDRAM is performing the data transfer (which can vary from device to device due to process variations), make it difficult to predict the total amount of skew that will occur in the system. Nonetheless, similar problems as discussed above may be associated with write operations, as well as in source synchronous interfaces other than SDRAM interfaces.

Therefore, a significant need has arisen in the art for a manner of minimizing the adverse effects of glitches or other indeterminate signals on a data strobe line to prevent inadvertent latching in a source synchronous interface. In particular, a significant need exists for a manner of preventing inadvertent data latching in a DDR SDRAM memory interface.

SUMMARY OF THE INVENTION

The invention addresses these and other problems associated with the prior art by providing a circuit arrangement and method for use in connection with a data latch that is coupled to a data source over a source synchronous communications interface. The circuit arrangement and method, in particular, disable the data latch from latching data from the data source whenever the data source is not driving the source synchronous data strobe signal. As such, when the data source is not driving the source synchronous data strobe signal, undesired and/or inadvertent latching by the data latch can be avoided. Moreover, in implementations where a data strobe signal line is bidirectional, and capable of being driven either by the data source or by another circuit used to access the data source (e.g., a memory controller), disabling data latching as described herein can minimize the risk of driver damage resulting from conflicting attempts to drive the data strobe signal line at both ends.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

BRIEF DESCRIPTION OF THE DRAWINGS

FIG. 1 is a block diagram of a data processing system incorporating a memory controller consistent with the invention.

FIG. 2 is a block diagram illustrating an exemplary DDR SDRAM source synchronous communications interface utilized by the data processing system of FIG. 1.

FIG. 3 is a block diagram illustrating in greater detail a memory controller consistent with the invention.

FIG. 4 is a block diagram of the DQS gate circuit of FIG. 3.

FIG. 6 is a block diagram of an alternate embodiment that utilizes a multiplexer to disable a data latch in a manner consistent with the invention.

DETAILED DESCRIPTION

Figure 5:
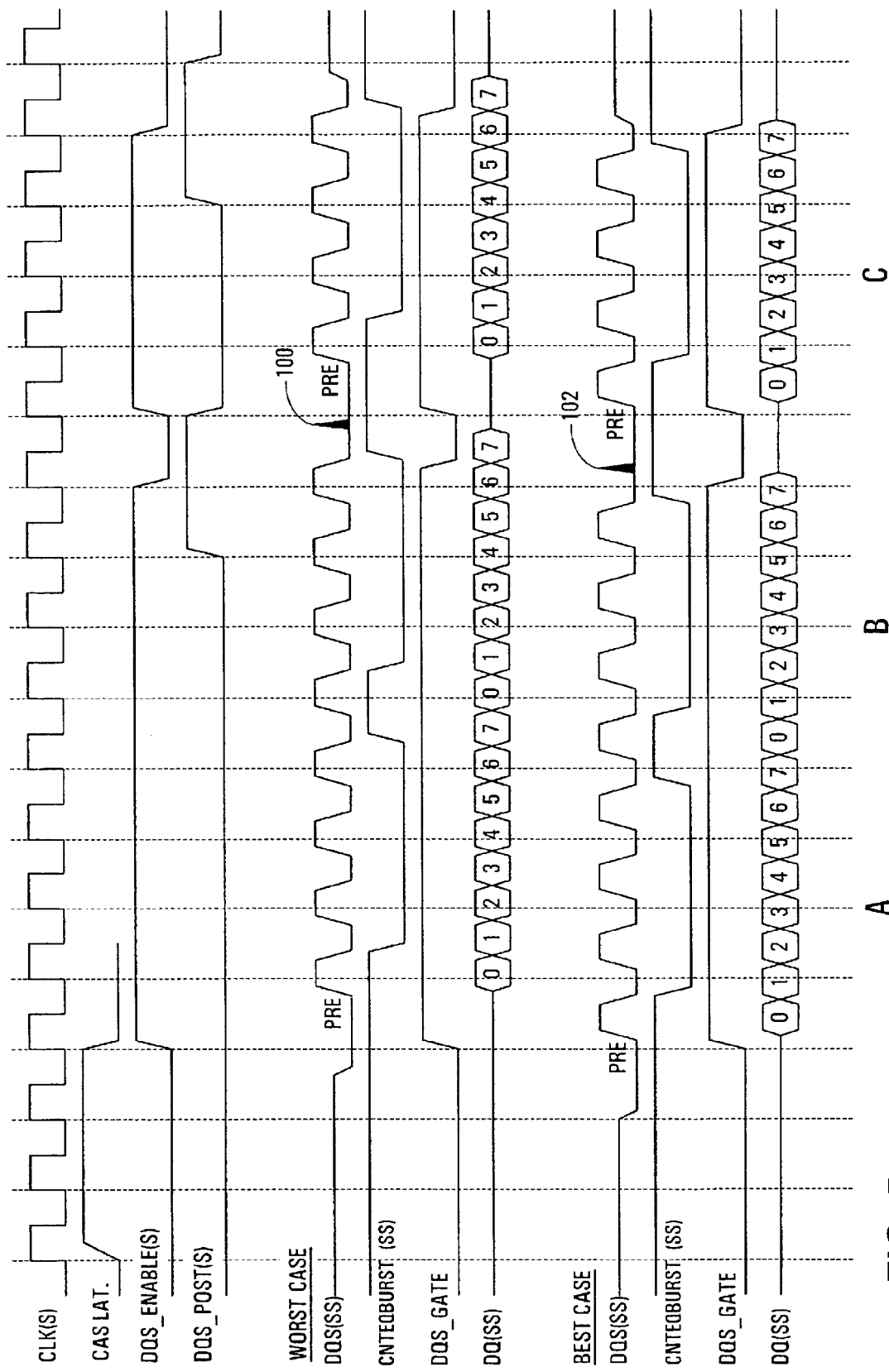
FIG. 5 is a timing diagram illustrating an exemplary series of read accesses performed by the memory controller of FIG. 3.

The embodiments discussed herein minimize the adverse effects of glitches or other indeterminate states on a data strobe signal in a source synchronous communications interface by gating a data latch on a target device to disable latching whenever a data source is not driving the data strobe signal. In the context of the invention, a source device refers to the device coupled to a source synchronous communications interface that is driving the data strobe and data signals during a data transfer, while a target device refers to the device that is attempting to receive and capture, or latch, one or more data signals responsive to the data strobe signal. Given that a source synchronous communications interface may be bidirectional, it will be appreciated that a particular device may function at different times as either a source or a target consistent with the invention.

The embodiments discussed hereinafter focus on an implementation of the invention in a synchronous dynamic random access (SDRAM) environment, in particular a double data rate (DDR) SDRAM memory interface between an application chip such as a memory controller and one or more DDR SDRAM memory devices. In such an environment, the data strobe signal is referred to as DQS, while the data lines are referred to as DQx ("DQ" will simply be used herein to refer to one or more of such lines). Moreover, a memory operation such as a read or write operation is initiated by the application chip, and includes a data transfer portion during which data is actually being transmitted across the interface. While the discussion hereinafter will focus on data transfers in the abstract, it should be appreciated that a data transfer will typically refer to that portion of a memory operation during which data is actually being transferred, and possibly disregarding other cycles during a memory operation such as during the transmission of commands and related handshaking cycles. In particular, a data transfer in the context of a DDR SDRAM memory operation refers to the cycles during which the DQS line is being actively driven, including during the actual transfer of data over the DQ lines, as well as during the preamble and postamble periods defined by the DDR SDRAM Specification.

Given, however, that the invention may be utilized in memory interface environments other than SDRAM environments, as well as in source synchronous communication environments other than memory interface environments, the aforementioned terminology that is utilized hereinafter with regard to signal nomenclature, data transmission protocols, etc., should not be considered to limit the invention.

Turning to the Drawings, wherein like numbers denote like parts throughout the several views, FIG. 1 illustrates a data processing system or apparatus 10 including a chipset, or corelogic 12 for use in interfacing a central processing unit (CPU) 14 such as a microprocessor with a system memory 16 over a source synchronous communications interface. Chipset 12 may incorporate a memory controller 18 for managing memory operations with system memory 16. As is well known in the art, chipset 12 may also incorporate additional functionality such as providing an interface with peripheral devices such as a network interface 20, user input/output 22 (e.g., displays, graphics controllers, keyboards, mice, etc.), and a mass storage device 24. Apparatus 10, for example, may be a personal computer such as a PC or Macintosh based computer, although other forms of computers, e.g., handheld computers, multi-user computers, servers, mainframes, portable computers, as well as other forms of electronic devices, may also be considered to be an apparatus consistent with the invention.

Memory controller 18 of chipset 12 is typically configured to receive access requests from a requester such as the CPU 14, and in response to such requests, to initiate a memory operation with system memory 16 over a communications interface between the chipset and the system memory. Requests may also be initiated by other devices, e.g., for direct memory access operations with a peripheral device.

It should be recognized that the term "apparatus" may be considered to incorporate various data processing systems such as computers and other electronic devices, as well as various components within such systems, including individual integrated circuit devices or combinations thereof. Moreover, within an apparatus may be incorporated one or more circuit arrangements, typically implemented on one or more integrated circuit devices, and optionally including additional discrete components interfaced therewith. Thus, for example, chipset 12 may be implemented in one or more integrated circuit devices that are separate from CPU 14 and/or system memory 16. In other embodiments, however, system memory 16 may be embedded on the same integrated circuit device as the CPU, whereby chipset 12 may likewise be embedded on the same device.

It should also be recognized that circuit arrangements are typically designed and fabricated at least in part using one or more computer data files, referred to herein as hardware definition programs, that define the layout of the circuit arrangements on integrated circuit devices. The programs are typically generated in a known manner by a design tool and are subsequently used during manufacturing to create the layout masks that define the circuit arrangements applied to a semiconductor wafer. Typically, the programs are provided in a predefined format using a hardware definition language (HDL) such as VHDL, verilog, EDIF, etc. Thus, while the invention has and hereinafter will be described in the context of circuit arrangements implemented in fully functioning integrated circuit devices, those skilled in the art will appreciate that circuit arrangements consistent with the invention are capable of being distributed as program products in a variety of forms, and that the invention applies equally regardless of the particular type of signal bearing media used to actually carry out the distribution. Examples of signal bearing media include but are not limited to recordable type media such as volatile and non-volatile memory devices, floppy disks, hard disk drives, CD-ROMs, and DVDs, among others, and transmission type media such as digital and analog communications links.

As discussed above, the principles of the invention may be applicable to practically any source synchronous communications interface, in particular, where the device that functions as the source of data during a memory operation generates the clock or data strobe signal that is utilized to clock or latch the data output by the device at the target device for the data, regardless of whether another device is used to initiate the memory transfer. One such exemplary source synchronous communications interface is a DDR SDRAM interface, which is illustrated in FIG. 2. However, other memory interfaces, as well as interfaces for other devices (e.g., network interfaces, inter-chip interfaces, storage device interfaces, etc.), may also benefit from the principles discussed herein. Nonetheless, the discussion hereinafter will focus predominantly on a DDR SDRAM memory interface by way of example, e.g., as defined by the *JEDEC Double Data Rate (DDR) SDRAM Specification*, JESD79 (June 2000). The invention, however, should not be limited solely to use in such an environment.

The discussion hereinafter will also focus predominantly on the gating of a DQS signal with respect to read-type SDRAM memory operations. This is based upon the fact that read-type memory operations typically have relatively greater signal skew, since additional delay variances arise with such operations due to the fact that a different device from the data source initiates such operations. However, it will be appreciated that similar gating circuitry may also be utilized for write operations in other embodiments as well or in the alternative to read operations.

FIG. 2, in particular, illustrates an application chip 30 coupled to a DDR SDRAM 32 over a source synchronous communications interface 34 consistent with the aforementioned specification. As is known in the art, control signals such as a clock signal, row address strobe (RAS) signal, column address strobe (CAS) signal, address signals, and other handshaking-type signals are driven by application chip 30 and received by memory 32. To perform data transfer, one or more data lines, referred to herein as "DQ" lines, as well as a data strobe line (DQS), are provided between devices 30, 32, with each such line capable of being driven by whichever of the devices is functioning as the source of data for a particular memory operation. For a read operation, SDRAM 32 serves as the source, while application chip 30 serves as the target. The converse is true for a write operation.

As is also well known in the art, the clock on SDRAM 32 is typically derived from the synchronous clock on the application chip (or alternatively, from an external clock signal supplied to both the application chip and SDRAM). Due to delay variations in clock generation, delay variations in clock-off chip driver, and the clock net variations on a circuit board, there is a range of possible clock arrival times at the SDRAM clock pin input. The SDRAM 32 uses the clock as a reference to launch the DQS signal back to the application chip for SDRAM read operations. Internal memory logic variation can also add uncertainty between the clock input at the SDRAM 32 and the DQS output. DQS driver delay and net variation can add additional uncertainty. The skew between the application chip's internal synchronous clock and the source synchronous DQS signal returning to the application chip is the summation of all the skews in the path, and may vary as much as one clock cycle in different embodiments.

Under the SDRAM Specification, the DQS signal requires a one clock cycle preamble and a one-half clock cycle postamble. During the preamble and postamble, DQS must be driven low.

Embodiments consistent with the invention attempt to minimize the adverse effects of glitches or other indeterminate states on the DQS line by a disabling latching by a target device whenever a source device is not driving the DQS signal. In the embodiments discussed hereinafter, a combination of synchronous (i.e., based on the target device clock domain) signals and source synchronous (i.e., based on the source device clock domain) signals are utilized to create a signal for disabling data latching by gating the application of the DQS signal to one or more data latches on the target device that capture the data on the DQ lines. When latching is disabled, any glitches or other indeterminate states for the DQS signal will be prevented from activating the latches on the target device to latch the data on the DQ lines.

It has been found that, because the preamble for an SDRAM memory operation is specified to be one clock cycle, and the clock to DQS input skew is typically less than one clock cycle in many environments, a synchronous control signal can often be used to enable the gating of the DQS signal at the start of a read data transfer. The synchronous signal used to enable the DQS signal at the start of a read may be selected to turn on or assert just prior to the rising edge of DQS on the first data transfer for a worst case (WC) slow DQS arrival time. Then, if the DQS signal arrives with best case (BC) fast time, the one cycle preamble where the DQS signal is driven low by the SDRAM covers up to one cycle of skew between the worst case and best case DQS arrival times. However, because the postamble is only one-half clock cycle and the DQS skew can be greater, synchronous control signals typically cannot be used to degate DQS at the end of a transfer. Instead, in the illustrated embodiments, counter circuits clocked with the source synchronous DQS signal are used to identify the end of a data transfer. The DQS signal is degated with the output of these source synchronous counter circuits unless there is another read data transfer immediately following it.

Data transfers are always executed with a known burst length in an SDRAM environment, and as such, the illustrated embodiments utilize the known burst transfer length to in effect "count" data transfer cycles and predict when the end of a data transfer is going to occur.

FIG. 3 illustrates one implementation of application chip 30, as a memory controller 40 utilized to control the transfer of data over the source synchronous SDRAM interface with one or more DDR SDRAM devices. Memory controller 40 typically includes control logic 42, typically including sequencers, state machines, pipelines and other control circuitry utilized to manage memory operation over the source synchronous interface, as is well known in the art. Memory controller 40 is typically utilized to interface a processor and/or input/output device with a memory, and in this regard, processor/IO interface circuitry 44 is utilized to interface the memory controller with a processor or other type of memory requester. Likewise, to provide an interface with the SDRAM over the source synchronous communications interface, driver and receiver circuitry 46 is utilized, as is also well known in the art. Separate dataflow paths are also typically designated for write and read data, as illustrated in blocks 48 and 50.

Control logic 42 typically generates a number of signals to control the progress of memory operations consistent with the DDR SDRAM Specification. Control logic 42, in particular, generates the clock, RAS, CAS and address signals output over the source synchronous communications interface to the memory. Moreover, various control signals are provided to each of the write dataflow and read dataflow blocks 48, 50 to control the latching of data in each of these blocks.

The data lines (DQ) for the source synchronous communications interface are bidirectional, and coupled to each of blocks 48 and 50 via driver/receiver circuitry 46. Likewise, the DQS data strobe signal is bidirectional as well, with the receiver allocated thereto in circuitry 46 coupled to a DQS gate circuit 52 that is utilized to gate the DQS signal in the manner described herein. A DQS delay circuit 54 is also interposed between the DQS gate circuit 52 and read dataflow block 50 to insert a one-half cycle delay to the DQS signal, as is required by the DDR SDRAM Specification, to align DQS with the center of DQ lines during read operations. It should be appreciated that in other environments, the insertion of a fixed delay may not be required.

To control gating of the DQS signal in DQS gate circuit 52, a pair of synchronous control signals DQS_ENABLE and DQS_POST are generated by the read sequencer in control logic 42. In addition, as will be discussed below, the source synchronous DQS signal is also utilized in this gating function. Thus, a combination of synchronous and source synchronous signals are utilized to provide the gating functionality described herein.

FIG. 4 illustrates one exemplary implementation of DQS gating circuit 52 consistent with the invention. As shown in this figure, the inputs to circuit 52 include the source synchronous DQS signal, which performs the dual function of being the data strobe and a gate for that data strobe, as well as synchronous DQS_ENABLE and DQS_POST signals that are generated locally by the read sequencer in the memory controller.

Circuit 52 includes a counter circuit, gated by the DQS signal, and used to count the number of data transfer cycles that have occurred during a data transfer portion of a memory operation. In the illustrated implementation, the counter circuit is implemented using a two-bit counter 60 coupled to a comparator 62. Given the burst length of eight defined by the DDR SDRAM Specification, and also given the two-transfer-cycles-per-clock-cycle nature of DDR SDRAM transfers, a read data transfer typically encompasses four full cycles of the DQS signal. Thus, a two-bit counter 60, triggered on the falling edge of a clock input to the counter, is used in the illustrated implementation. The value stored in the counter is provided to comparator 62 and compared to a value of "00" (the initial value for the counter at the beginning of each data transfer operation), such that a burst length signal CNTEQBURST may be output and asserted at both the beginning and end of a four cycle burst.

An AND gate 64 is utilized to gate the DQS signal using a DQS_GATE signal generated by a series of logic gates 66–70, resulting in the generation of a gated DQS signal applied to DQS delay block 54. Once delayed, the gated DQS signal is referred to as a delayed DQS signal, which is applied to one or more latches 56 in read dataflow block 50. A latch may be considered to be any circuitry (e.g., a buffer) that stores data signals from one or more DQ lines, including single or multi-bit latches. The gating circuit may also be used to gate multiple latches consistent with the invention.

As discussed above, the DQS signal is also used in the gating circuitry, and in the illustrated embodiment, this is represented by the provision of the gated DQS signal to an inverter 72 applied to the clock input of counter 60. Inverter 72 is utilized to logically invert the gated DQS signal so that, when coupled with a counter that is triggered upon a rising edge transition at its clock input, the counter will be incremented upon each falling edge of the gated DQS signal.

In the illustrated implementation, the logic functionality utilized to gate the DQS signal is based upon the following logic function:

DQS_GATE=DQS_ENABLE OR (DQS_POST AND NOT CNTEQBURST)

To implement this function, an inverter 66 is utilized to invert the CNTEQBURST signal, with this inverted signal applied to an AND gate 68 to perform a logical AND with the DQS_POST signal, and with the output of gate 68 logically-OR'ed with the DQS_ENABLE signal in OR gate 70. The output of gate 70 is the DQS_GATE signal utilized to gate the DQS signal as described herein.

As discussed above, generation of the DQS_ENABLE and DQS_POST signals is performed by a local read sequencer for the target device (here, the memory controller). In the illustrated embodiment, it is desirable for the read sequencer to assert the DQS_ENABLE signal X cycles after the read command is sent to the SDRAM, which in the SDRAM Specification is the number of cycles corresponding to the SDRAM CAS access latency. For example, where the CAS access latency is three clock cycles, the DQS_ENABLE signal is asserted three cycles after the CAS signal is latched, also corresponding to the amount of time it takes the SDRAM to output data once requested by an application chip. Once activated, the DQS_ENABLE signal stays active for four clock cycles, corresponding to the burst length of SDRAM data transfers. The DQS_POST signal, on the other hand, is asserted prior to the last cycle of a burst, and typically asserted for two cycles to ensure that the last negative edge of DQS is overlapped.

The DQS_POST signal may be asserted at the proper time by simply activating the signal three clock cycles after DQS_ENABLE goes active, and then staying active for two clock cycles.

Coupling these two synchronous signals with the burst length signal generated by counter 60 and comparator 62, the desired DQS gating timings are achieved.

As shown in FIG. 5, for example, the operation of the aforementioned source synchronous interface during worst case (WC) and best case (BC) skew conditions are illustrated for three memory read operations A, B and C. Memory operations A and B are shown as operating back-to-back, whereby no delay is present between the preamble and postamble phases of the DQS signal. It is to be noted, for example, that, in this situation, DQS_POST is not asserted, and as a result, the DQS_GATE signal is asserted during the preamble of memory operation A and is not deasserted until the postamble of memory operation B. However, where a delay does exist between memory operations B and C, the DQS_GATE signal is deasserted during this period such that any glitch (e.g., glitch 100 for the worst case scenario and glitch 102 for the best case scenario) will not pass through to the data latches and cause an inadvertent latching operation to occur.

Various modifications may be made to the illustrated embodiments without departing from the spirit and scope of the invention. For example, different latching arrangements may be utilized to restrict inadvertent latching consistent with the invention. For example, an alternative latching arrangement is shown in FIG. 6, where a circuit arrangement 90 is illustrated with a read dataflow block 92 including an exemplary latch 94 that is fed by a multiplexer 96. The output of multiplexer 96 is fed to the data input of latch 94, with the output of the latch fed back to one input of the multiplexer. The DQ lines are fed to the other input of the multiplexer, and the DQS_ENABLE signal is applied to the multiplexer to select one of the two inputs. The DQS data strobe signal is supplied ungated to the latch 92; however, the net effect of the circuit arrangement is that, whenever DQS_ENABLE is not asserted, the current value stored in the latch will be fed back and latched again into the latch. As such, latching of data by data latch 94 is effectively disabled, so it should be considered that disabling the latching of a data latch may also incorporate latching old data in lieu of latching data from the associated data lines.

Other modifications will be apparent to one of ordinary skill in the art. Therefore, the invention lies in the claims hereinafter appended.

What is claimed is:

1. A method of transmitting data over a source synchronous communications interface, the method comprising:
   (a) receiving a source synchronous data strobe signal driven by a data source during a data transfer from the data source; and
   (b) disabling a data latch from latching data received from the data source whenever the data source is not driving the source synchronous data strobe signal.

2. The method of claim 1, wherein disabling the data latch comprises gating the source synchronous data strobe signal.

3. The method of claim 2, wherein gating the source synchronous data strobe signal comprises applying a gate signal to the data latch that enables latching by the data latch only when the gate signal is asserted, wherein the gate signal is asserted proximate a start of a data transfer from the data source, and deasserted proximate an end of the data transfer from the data source.

4. The method of claim 3, wherein applying the gate signal comprises asserting the gate signal responsive to a synchronous enable signal that is asserted proximate the start of the data transfer from the data source.

5. The method of claim 4, wherein applying the gate signal further comprises deasserting the gate signal responsive to a synchronous postamble signal that is asserted proximate the end of the data transfer from the data source.

6. The method of claim 1, further comprising locally tracking progress of the data transfer from the data source.

7. The method of claim 6, wherein locally tracking the progress of the data transfer includes counting cycles of the source synchronous data strobe signal to track data transfer cycles during a data transfer from the data source.

8. The method of claim 7, wherein locally tracking the progress of the data transfer further includes indicating whenever the number of data transfer cycles is equivalent to a burst length for the data transfer.

9. The method of claim 1, wherein the data source comprises a synchronous dynamic random access memory (SDRAM), and wherein the source synchronous communications interface comprises an SDRAM memory interface.

10. The method of claim 9, wherein the data source comprises a double data rate (DDR) SDRAM, and wherein the source synchronous communications interface comprises a DDR SDRAM memory interface.

11. The method of claim 2, wherein gating the source synchronous data strobe signal comprises:
   (a) incrementing a counter and outputting a burst length signal that indicates whether the counter stores a value equivalent to a predetermined burst length;
   (b) performing a logical AND operation on the burst length signal and a synchronous postamble signal and outputting therefrom a first output signal, wherein the synchronous postamble signal is asserted proximate the end of a data transfer from the data source;
   (c) performing a logical OR operation on the first output signal and a synchronous enable signal and outputting therefrom a gate signal, wherein the synchronous enable signal is asserted during the data transfer from the data source; and
   (d) performing a logical AND operation on the gate signal and the source synchronous data strobe signal and outputting therefrom a gated source synchronous data strobe signal that is coupled to the data latch.

12. The method of claim 11, wherein incrementing the counter is performed in response to a logically-inverted gated source synchronous data strobe signal, and wherein the method further comprises logically-inverting the burst length signal prior to performing the logical AND operation.

13. The method of claim 1, wherein disabling the data latch comprises controlling a select input on a multiplexer coupled to an input of the data latch to select a first input among first and second inputs for the multiplexer, wherein the first input of the multiplexer is coupled to an output of the data latch, and the second input of the multiplexer is coupled to receive the data from the data source.

14. The method of claim 1, wherein the source synchronous data strobe signal comprises a DQS signal from a synchronous dynamic random access memory (SDRAM) during a transfer of read data from the SDRAM.

15. A method of transferring read data from a synchronous dynamic random access memory (SDRAM) over a source synchronous communications interface, the method comprising:
   (a) receiving a source synchronous DQS signal driven by the SDRAM during a data transfer of read data from the SDRAM; and
   (b) selectively disabling a data latch from latching data received from the SDRAM source whenever the SDRAM is not driving the DQS signal.

* * * * *